(12) United States Patent
Oh et al.

(10) Patent No.: US 8,619,913 B2
(45) Date of Patent: Dec. 31, 2013

(54) METHOD OF SELECTING METRICS AND RECEIVER USING THE SAME

(75) Inventors: Jong Ee Oh, Daejeon (KR); Hun Sik Kang, Daejeon (KR); Jung Bo Son, Daejeon (KR); Sok Kyu Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 21 days.

(21) Appl. No.: 13/450,336

(22) Filed: Apr. 18, 2012

(65) Prior Publication Data
US 2012/0294390 A1 Nov. 22, 2012

(30) Foreign Application Priority Data
May 19, 2011 (KR) .................. 10-2011-0047274

(51) Int. Cl.
*H03K 9/00* (2006.01)
(52) U.S. Cl.
USPC ........... 375/316; 375/262; 375/340; 714/780; 714/794

(58) Field of Classification Search
USPC .......... 370/321; 375/262, 265, 269, 316, 340; 708/603; 714/746, 780, 795
See application file for complete search history.

(56) References Cited

U.S. PATENT DOCUMENTS

| | | | |
|---|---|---|---|
| 8,266,510 B1* | 9/2012 | Chen et al. ................ | 714/794 |
| 2003/0106011 A1* | 6/2003 | Miyauchi et al. ............ | 714/780 |
| 2006/0088118 A1* | 4/2006 | Wu et al. .................... | 375/262 |
| 2009/0147887 A1* | 6/2009 | Bahng et al. ................ | 375/340 |

OTHER PUBLICATIONS

M. Joham et al., "FPGA Implementation of MMSE Metric Based Efficient Near-ML Detection", International ITG Workshop on Smart Antennas, Feb. 2008, pp. 139-146, Technische Universität München, Munich, Germany.

* cited by examiner

*Primary Examiner* — Leon-Viet Nguyen

(57) ABSTRACT

A method and apparatus of selecting N metrics among M metrics is provided. The apparatus determines M metrics P(i), where i=1, . . . , M. Each P(i) is represented by B bits. The apparatus determines N metrics among M metrics. The complexity for configuring the circuit is decreased, and the length of the critical path is reduced.

15 Claims, 12 Drawing Sheets

METHOD OF SELECTING METRICS AND RECEIVER USING THE SAME

CROSS-REFERENCE TO RELATED APPLICATIONS

This application claims the benefit of priority of Korean Patent Application No. 10-2011-0047274 filed on May 19, 2011, all of which is incorporated by reference in its entirety herein.

BACKGROUND OF THE INVENTION

1. Field of the Invention

The present invention relates to data processing, and more particularly, to a method and apparatus of selecting N metrics among M metrics.

2. Related Art

A wireless communication system has been prevalently developed in order to provide various kinds of communication services such as audio, data, or the like. Generally, the wireless communication system is a multiple access system that may share available system resources (bandwidth, transmission power, or the like) to support communication with multi-user. Examples of a multiple access system may include a code division multiple access (CDMA) system, a frequency division multiple access (FDMA) system, a time division multiple access (TDMA) system, an orthogonal frequency division multiple access (OFDMA) system, a single carrier frequency division multiple access (SC-FDMA) system, or the like.

Multiple input multiple output (MIMO) is a technology that has been interested due to characteristics that a throughput increases without allocating additional resources. Channel capacity of the MIMO system mainly depends on a detection method used in a receiver in order to restore a received signal. Therefore, a detection method implementing both of high performance and low complexity has been interested.

Maximum likelihood (ML) detection has been known as a MIMO detection method that may obtain most ideal performance by searching all signal vectors in order to restore a modulated signal. However, the ML detection has a problem that complexity exponentially increases as the number of transmit antennas increases.

QR-decomposition with M-algorithm (QRD-M) is one of methods developed as an alternative to the ML detection having high complexity. A mobile terminal uses limited power and is vulnerable to latency. Therefore, it is difficult to use a detection method having a high deviation and arbitrarily changed complexity. The QRD-M trades off between bit error rate (BER) performance and complexity to have fixed complexity and excellent BER performance.

The QRD-M has a tree-search structure having a trade-off between performance and a calculation amount according to a size of M, which is the number of survivor paths. However, since a large M value including accurate paths in all steps should be used in order to approach performance of the ML detection, a large calculation amount is required.

SUMMARY OF THE INVENTION

The present invention provides a method and apparatus of calculating N minimum values by sequentially searching the most significant bit (MSB) to the least significant bit (LSB) from M metrics.

In an aspect, a method of selecting N metrics among M metrics, where M>N≥1, is provided. The method includes determining M metrics $P(i)=[b_i(B-1) \ldots b_i(1)\ b_i(0)]$, where $i=1, \ldots, M$, each $P(i)$ being represented by B bits, initializing two comparison values, $P(i)^0$ and $P(i)^1$, to zero for each $P(i)$, determining a sum of j-th bit for M $P(i)$s, where $j=0, 1, \ldots, B-1$, as shown:

$$\text{sum}(j) = \sum_{i=1}^{M} (\sim P(i)^0)\ \&\ (P(i)^1\ |\ b_i(j))$$

where sum(j) denotes the sum of j-th bit for M $P(i)$s, '~' denotes a bit inversion operation, '&' denotes a bit AND operation, and '|' denotes a bit OR operation, updating $P(i)^0$ and $P(i)^1$ for each $P(i)$ by comparing sum(j) and (M−N), and selecting at least one $P(i)$ having a $P(i)^0$ value of 1 among M $P(i)$s.

The method may further include selecting at least one $P(i)$ having a $P(i)^0$ value of 1 and a $P(i)^1$ value of 0 when the number of selected $P(i)$ is smaller than N.

The step of updating $P(i)^0$ and $P(i)^1$ for each $P(i)$ may include updating $P(i)^0$ to 1 with respect to i in which) $(\sim P(i)^0)\&(P(i)^1|b_i(j))=0$ when sum(j) is larger than (M−N).

The step of updating $P(i)^0$ and $P(i)^1$ for each $P(i)$ may include updating $P(i)^1$ to 1 with respect to i in which $(\sim P(i)^0)\&(P(i)^1|b_i(j))=1$ when sum(j) is smaller than (M−N).

The step of updating $P(i)^0$ and $P(i)^1$ for each $P(i)$ may include when sum(j) is the same as (M−N), updating $P(i)^0$ to 1 with respect to i in which $(\sim P(i)^0)\&(P(i)^1|b_i(j))=0$ and updating $P(i)^1$ to 1 with respect to i in which $(\sim P(i)^0)\&(P(i)^1|b_i(j))=1$.

In another aspect, a method of receiving data is provided. The method includes receiving a receive signal from a transmitter, determining M metrics $P(i)=[b_i(B-1) \ldots b_i(1)\ b_i(0)]$, where $i=1, \ldots, M$, based on a channel on which the receive signal is received, each $P(i)$ being represented by B bits, determining N metrics among the M $P(i)$s, where M>N≥1, and restoring a transmit signal transmitted by the transmitter from the receive signal based on the N metrics.

In still another aspect, a receiver includes a receive circuit configured for receiving a receive signal from a transmitter, a metric determining unit configured for determining M metrics $P(i)=[b_i(B-1) \ldots b_i(1)\ b_i(0)]$, where $i=1, \ldots, M$, based on a channel on which the receive signal is received, each $P(i)$ being represented by B bits, and determining N metrics among the M $P(i)$s, where M>N≥1, and a restoring unit configured for restoring a transmit signal transmitted by the transmitter from the receive signal based on the N metrics.

DESCRIPTION OF EXEMPLARY EMBODIMENTS

Figure 1:
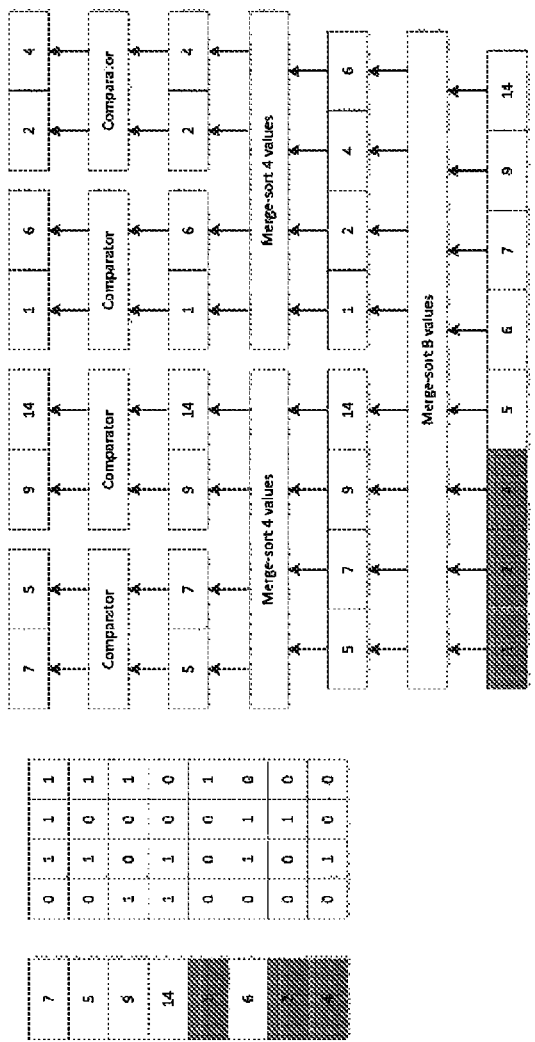
FIG. 1 shows a Merge-Sort process of calculating 3 metrics among 8 metrics.

QR-decomposition with M-algorithm (QRD-M) is a method based on a tree-search algorithm. The tree-search algorithm selects M paths determined to have high reliability among path metrics extended in each step and does not consider remaining paths.

In order to describe general QRD-M, a MIMO system including T transmit antennas and L receive antennas is considered.

A receive signal vector y is represented as follows:

$$y = Hs + n \quad \text{[Equation 2]}$$

where s means a transmit signal vector, H means a channel matrix having a T×L size, and n means a noise vector. A component $h_{ij}$ of the i-th row and j-th column of H indicates a channel gain between the j-th transmit antenna and the i-th receive antenna.

QR decomposition is performed on the channel matrix H to obtain a normal orthogonal matrix Q having a L×L size and an upper triangular matrix R having a T×T size as follows.

$$H = QR \quad \text{[Equation 2]}$$

Let a conjugate transpose matrix of Q be $Q^H$. $Q^H Q = I$. Here, I means an identity matrix.

Both sides of Equation 1 are multiplied by $Q^H$ to obtain the following Equation:

$$\tilde{y} = Rs + \tilde{n} \quad \text{[Equation 3]}$$

where $\tilde{y} = Q^H y$ and $\tilde{n} = Q^H n$.

A receive vector of Equation 3 is divided for each row to obtain the following Equation:

$$\begin{aligned}
\tilde{y}_1 &= R_{1,1}s_1 + R_{1,2}s_2 + R_{1,3}s_3 + \ldots + R_{1,T}s_T + \tilde{n}_1 \\
\tilde{y}_2 &= \phantom{R_{1,1}s_1 + {}} R_{2,2}s_2 + R_{2,3}s_3 + \ldots + R_{2,T}s_T + \tilde{n}_2 \\
&\vdots \\
\tilde{y}_{T-1} &= R_{T-1,T-1}s_{T-1} + R_{T-1,T}s_T + \tilde{n}_{T-1} \\
\tilde{y}_T &= R_{T,T}s_T + \tilde{n}_T
\end{aligned} \quad \text{[Equation 4]}$$

where $s_k$ means the k-th component of a transmit vector s, $R_{j,k}$ means the j,k-th component of the upper triangular matrix R.

From Equation 4, it may be appreciated that it is most effective to perform estimation from the T-th transmit signal $s_T$ when there is no interference of other transmit signals.

First, a path metric in a detection step, that is, a step of estimating the T-th transmit signal $s_T$ may be calculated as follows:

$$\|\tilde{y}_T - R_{T,T}\tilde{s}_{T,l}\|^2 \quad \text{[Equation 5]}$$

where $\tilde{s}_{T,l}$ indicates the l-th candidate symbol of $s_T$.

Only N candidate paths in which the Euclidean distance value becomes minimum are selected, and remaining paths are deleted.

Next, the Euclidean distance value accumulated from the i-th detection step (T−i+1-th row of R) to the n-th detection step is represented by the following Equation:

$$\sum_{j=1}^{i} \left\| \tilde{y}_{T-j+1} - \sum_{k=T-j+1}^{T} R_{T-j+1,k}\tilde{s}_{k,l}(n) \right\|^2 \quad \text{[Equation 6]}$$

where $\tilde{s}_{k,l}(n)$ indicates the l-th candidate symbol of $s_k$ of the n-th path.

In order to assist the understanding, a QRD-M method may be described as follows.

(1) QR decomposes a channel matrix H.

(2) Multiply a receive signal vector y by $Q^H$ to form a format of Equation 3.

(3) Extend each of all paths to C nodes which are the number of candidate symbols.

(4) Calculate M path metric values using Equation 6.

(5) Select N survival paths having a minimum value after sorting the M path metric values in an ascending order.

(6) Return step (3) to repeat up to a final detection step.

(7) In a final detection step, select one path having a minimum value among path metrics accumulated up to now to estimate the selected path as a transmit signal.

A process of calculating a path metric among the above-mentioned processes occupies the largest calculation amount.

According to "FPGA implementation of MMSE metric based efficient near-ML detection", International ITG Workshop on Smart Antennas 2008, 2008-02, pp. 139-146, by M. Joham, L. G. Barbero, T. Lang, W. Utschick, J. Thompson, T. Ratnarajah, in order to obtain performance close to the ML detection, N paths having a short distance among M path metrics used in calculation of QRD-M are selected using 'Merge-Sort'. This scheme is a scheme of sorting M path metrics and selecting N path metrics having a minimum value among the M path metrics.

According to the conventional QRD-M, all of M metrics are first sorted when N metrics are selected among the M metrics.

Figure 2:
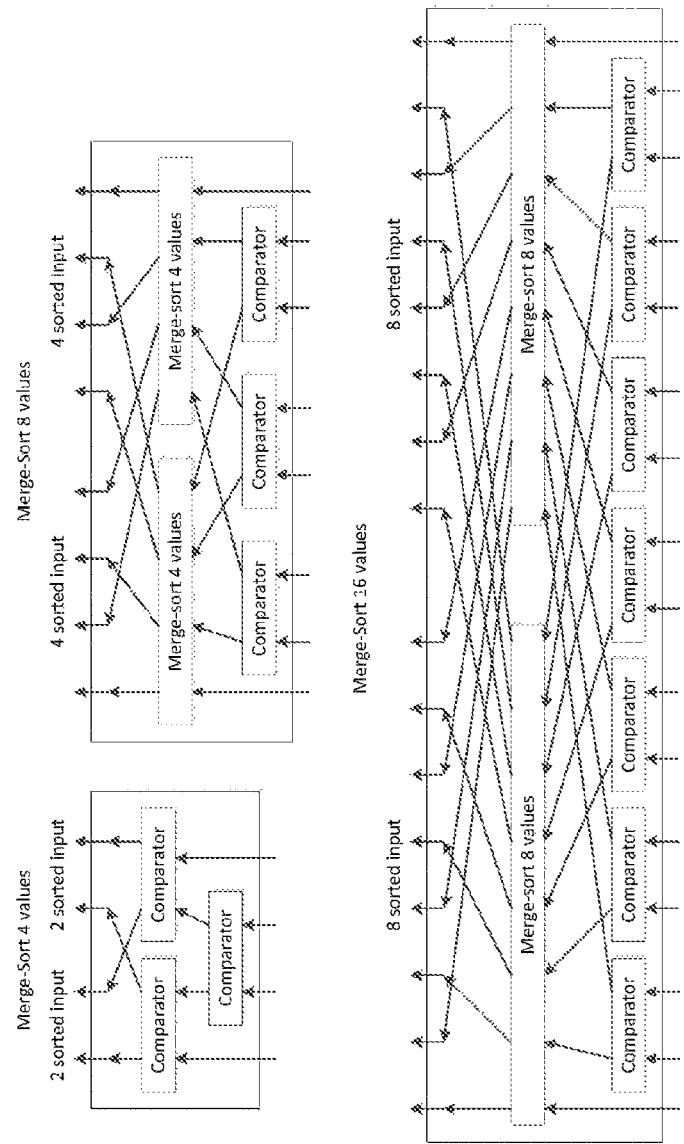
FIG. 2 shows Merge-Sort 4, 8, and 16 values.

FIG. 1 shows a Merge-Sort process of calculating 3 metrics among 8 metrics. FIG. 2 shows Merge-Sort 4, 8, and 16 values.

Since 8 metrics are present, they may be represented by a distance of 4 bits. As shown in FIG. 2, since each of Merge-Sort 4, 8, and 16 values passes through a critical path of two, three, and four comparators, a Merge-Sort process of calculating 3 minimum values among 8 distance values of 4 bits has a critical path passing through 6 comparators.

Figure 3:
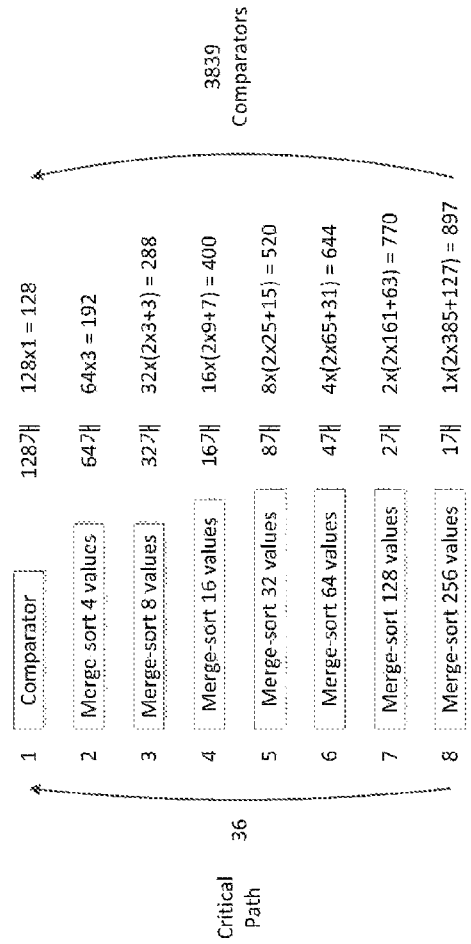
FIG. 3 shows a logic calculating 64 minimum values among 256 distance values.

FIG. 3 shows a logic calculating 64 minimum values among 256 distance values. It is shown that 36 critical paths passes through 3839 comparators in order to calculate 64 minimum values among 256 distance values.

Figure 4:
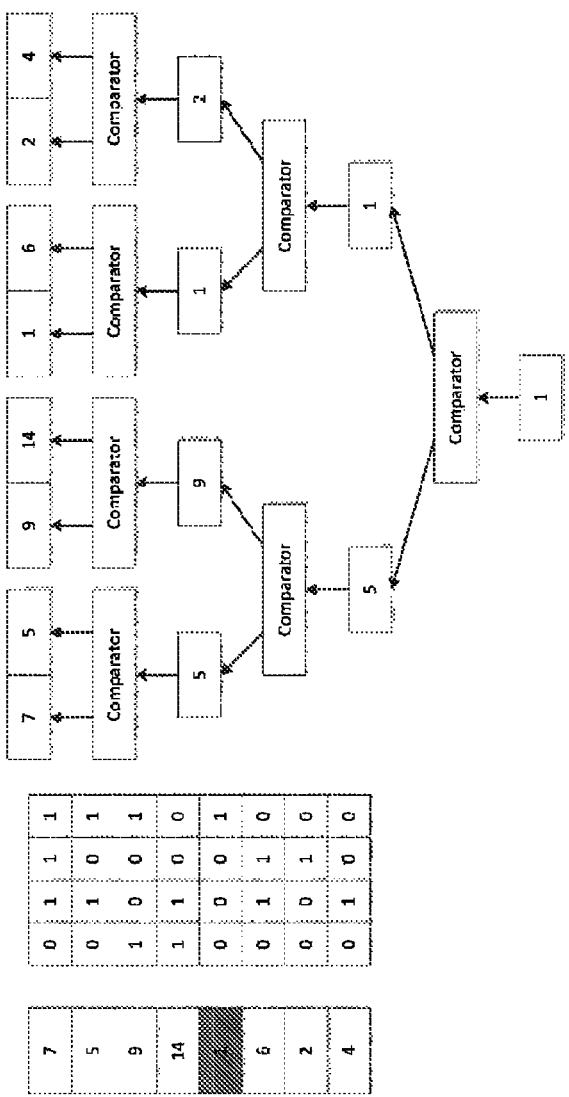
FIG. 4 shows a process of calculating 1 minimum value among 8 distance values of 4 bits.

FIG. 4 shows a process of calculating 1 minimum value among 8 distance values of 4 bits. This shows a critical path passing through 3 comparators.

In the conventional algorithm as described above, N values are selected after passing through complicated sorting.

Hereinafter, according to the present invention, a method of calculating N minimum values by sequentially searching the most significant bit (MSB) to the least significant bit (LSB) from M metrics without passing through a sorting algorithm is suggested.

Consider a case in which N metrics having a small size are selected among M metrics P(i) (i=1, 2, ..., M) represented by B bits. $P(i) = [b_i(B-1) \ldots b_i(1)\, b_i(0)]$.

The sum (sum(j)) of the j-th bits of M P(i)s is represented by the following Equation.

$$\text{sum}(j) = \sum_{i=1}^{M} b_i(j) \quad \text{[Equation 7]}$$

First, consider a case in which B=1.

P(i)=[$b_i(0)$]. The sum of the first bits of M P(i)s is represented by the following Equation.

$$\text{sum}(0) = \sum_{i=1}^{M} b_i(0) \quad \text{[Equation 8]}$$

When sum(0) is larger than (M−N), bits of which M-sum(0) $b_i(0)$ bit value is 0 are selected, and bits of which N−(M-sum(0)) $b_i(0)$ bit value is 1 are then arbitrarily selected.

When sum(0) is smaller than (M−N), N metrics are arbitrarily selected among things in which M-sum(0) $b_i(0)$ bit values are 0.

When sum(0) is the same as (M−N), things in which N $b_i(0)$ bit values are 0 are selected.

Next, consider a case in which B=2.

P(i)=[$b_i(1)\ b_i(0)$] is initialized to a bit P(i)$^0$=0, which means that it is selected as minimum values, and is initialized to a bit P(i)$^1$=0, which means that it is selected as maximum values. The sum, sum(1), of the second bits of M P(i)s is represented by the following Equation.

$$\text{sum}(1) = \sum_{i=1}^{M} b_i(1) \quad \text{[Equation 9]}$$

When sum(1) is larger than (M−N), with respect to i in which M-sum(1) $b_i(1)$ bits are 0, P(i)$^0$ is set to 1. When sum(1) is smaller than (M−N), with respect to i in which sum(1)$b_i(1)$ bits are 1, P(i)$^1$ is set to 1. When sum(1) is the same as (M−N), with respect to i in which sum(1) $b_i(1)$ bits are 0, P(i)$^0$ is set to 1, and with respect to i in which sum(1) $b_i(1)$ bits are 1, P(i)$^1$ is set to 1. With respect to any P(i), a case in which P(i)$^0$ and P(i)$^1$ are simultaneously 1 may not occur.

When the sum (sum(0)) of the first bits of M P(i)s is calculated, the P(i) selected as a minimum value in advance in previous calculation of the second bits allows an effect that $b_i(0)=0$ regardless of the $b_i(0)$ value to be generated, and the P(i) selected as a maximum value in advance in the previous calculation of the second bits allows an effect that $b_i(0)=1$ regardless of the $b_i(0)$ value to be generated.

Since P(i)s not selected in the calculation of the second bits corresponds to a case in which all of the second bits are 0 (that is, sum(1)<(M−N)) or a case in which all of the second bits are 1 (that is, sum(1)>(M−N)), an effect of the $b_i(0)$ value is reflected as it is. Since a case in which P(i)$^0$ and P(i)$^1$ are simultaneously 1 may not occur, when calculation changed into the following Equation is performed, all of the above-mentioned contents are included:

$$\text{sum}(0) = \sum_{i=1}^{M} (\sim P(i)^0)\ \&\ (P(i)^1\ |\ b_i(0)) \quad \text{[Equation 10]}$$

where '∼' indicates an inversion of a bit, '&' indicates an AND operation, and '|' indicates an OR operation.

The sum of the first bits in consideration of both of P(i)$^0$ and P(i)$^1$ of the M P(i)s is sum(0) of Equation 10.

When sum(0) is larger than (M−N), with respect to i in which M-sum(0)) (∼P(i)$^0$)&(P(i)$^1$|$b_i(0)$) bits are 0, P(i)$^0$ is set to 1. P(i)s having P(i)$^0$ of 1 are first selected as minimum values, and remaining minimum values are arbitrarily selected among P(i)s having P(i)$^0$ of 0 and P(i)$^1$ of 0.

When sum(0) is smaller than (M−N), with respect to i in which sum(0) (∼P(i)$^0$)&(P(i)$^1$|$b_i(0)$) bits are 1, P(i)$^1$ is set to 1. P(i)s having P(i)$^0$ of 1 are first selected as minimum values, and remaining minimum values are arbitrarily selected among P(i)s having which P(i)$^0$ of 0 and P(i)$^1$ of 0.

When sum(0) is the same as (M−N), with respect to i in which N) (∼P(i)$^0$)&(P(i)$^1$|$b_i(0)$) bits are 1, P(i)$^1$ is set to 1. P(i)s having P(i)$^0$ of 1 are selected as minimum values.

P(i)s having P(i)$^0$ set to 1 in the previous sum(1) calculation is maintained as P(i)$^0$=1 since)(∼P(i)$^0$)&(P(i)$^1$|$b_i(0)$)=0 regardless of $b_i(0)$, and P(i)s having P(i)$^1$ set to 1 in the previous sum(1) calculation is maintained as P(i)$^1$=1 since) (∼P(i)$^0$)&(P(i)$^1$|$b_i(0)$)=1 regardless of $b_i(0)$. Therefore, only in the case in which P(i)$^0$ and P(i)$^1$ are simultaneously 0, P(i)$^0$ or P(i)$^1$ is additionally set to 1 or is continuously maintained as 0.

With respect to any P(i), a case in which P(i)$^0$ and P(i)$^1$ are simultaneously 1 may not occur.

Hereinafter, a case in which P(i) is B bits is generalized and described.

In the case in which P(i) is B bits, it may be represented by the following pseudo-code.

```
---------- start ----------
for (i=0; i<M; i++) {
P(i)⁰=0 and P(i)¹=0
}
for(i=B−1; i≥0; i--) {
sum = 0
for(j=0; j<M; j++) { sum = sum + (~P(j)⁰)&(P(j)¹ |b_j(i)) }
if(sum > M−N) {
    for(j=0; j<M; j++) { if((~P(j)⁰&(P(j)¹ | b_j(i))==0) P(j)⁰=1 }
}
else if(sum < M−N) {
    for(j=0; j<M; j++) {if((~P(j)⁰&(P(j)¹ | b_j(i))==1) P(j)¹=1 }
}
else {
    for(j=0; j<M; j++) {
        if((~P(j)⁰)&(P(j)¹ | b_j(i))==0) P(j)⁰=1 else P(j)¹=1
    }
}
}
min = 0;
for (i=0; i<M; i++) {
if(P(j)⁰==1) { Choose P(i) and min = min + 1 }
}
for(i=0; i<M; i++) {
if(P(j)⁰==0 and P(j)¹==0) {
    if(min < N) { Choose P(i) and min = min+1 }
    else { exit }
}
}
for(i=0; i<M; i++) {
if(P(j)¹==1) {
    if(min < N) { Choose P(i) and min = min+1 }
    else { exit }
}
}
---------- end ----------
```

The fact that the above algorithm is valid may be proved through the following process.

(1) in the case in which B=1

(1-1) in the case in which the number of 0s among M is less than N sum(0) is larger than (M−N), such that P(i) having $b_i(0)$ of 0 becomes $P(j)^0=1$ to be selected as a minimum value, and remaining minimum values are selected among things in which $b_i(0)$ having $P(j)^0$ of 0 and $P(j)^1$ of 0 is 1. Therefore, the algorithm is valid.

(1-2) in the case in which the number of 0s among M exceeds N sum(0) is smaller than (M−N), such that P(i) having $b_i(0)$ of 1 becomes $P(j)^1=1$ to be not selected as a minimum value, and minimum values are selected among things in which $b_i(0)$ having $P(j)^0$ of 0 and $P(j)^1$ of 0 is 0. Therefore, the algorithm is valid.

(1-3) in the case in which the number of 0s among M is N sum(0) is equal to (M−N), such that P(i) having $b_i(0)$ of 0 becomes $P(i)^0=1$ to be selected as a minimum value. Therefore, the algorithm is valid.

(2) in the case in which B=k

In the case in which B=K, when it is assumed that extraction of n minimum values among m is valid by the above algorithm, in the case in which B=k+1, it is required to prove that the following case is valid.

(2-1) in the case in which the number of MSB 0s among M is less than N sum(k) is larger than (M−N), such that P(i) having $b_i(k)$ of 0 becomes $P(i)^0=1$. After selecting these values as minimum values, the above algorithm of selecting n=N−(M−sum(k)) minimum values among m=sum(k) has only to be performed.

A $(\sim P(i)^0) \& (P(i)^1 | b_i(j))$ value is always 0 regardless a $b_i(j)$ value during k>j>0.

(2-2) in the case in which the number of MSBs among M exceeds N sum(k) is smaller than (M−N), such that P(i) having $b_i(k)$ of 1 becomes $P(i)^1=1$. After selecting these values as minimum values, the above algorithm of selecting n=N minimum values among m=M−sum(k) has only to be performed.

A $(\sim P(i)^0) \& (P(i)^1 | b_i(j))$ value is always 1 regardless a $b_i(j)$ value during k>j≥1.

(2-3) in the case in which the number of MSBs among M is N sum(k) is equal to (M−N), P(i) having $b_i(k)$ of 0 becomes $P(i)^0=1$, and P(i) having $b_i(k)$ of 1 becomes $P(i)^1=1$. After selecting these values as minimum values and maximum values, the above algorithm of selecting n=0 minimum values among m=0 has only to be performed.

Figure 5:
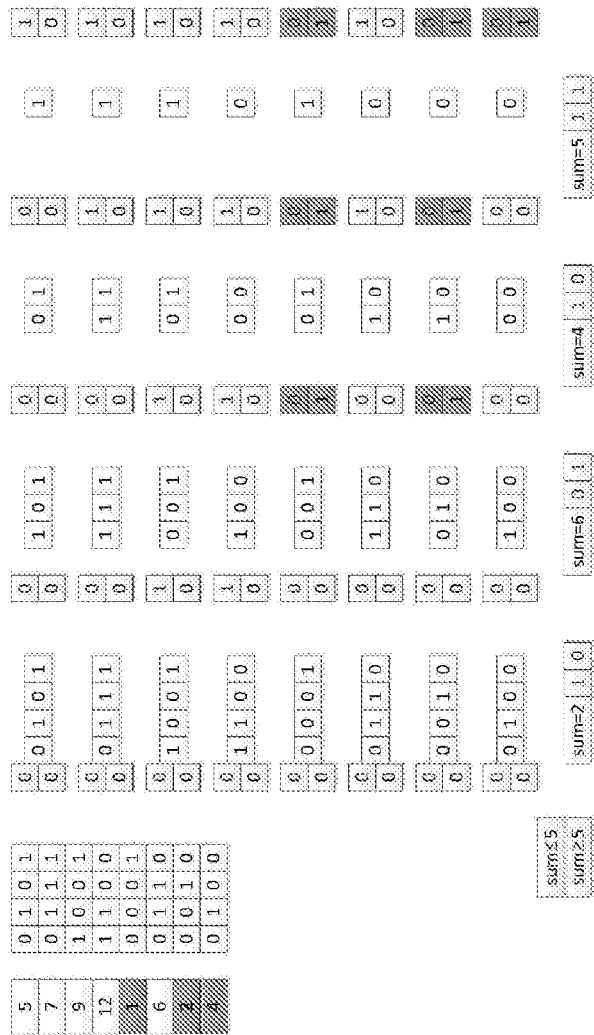
FIG. 5 shows a process of calculating 3 minimum values among 8 distance values of 4 bits according to an exemplary embodiment of the present invention.

FIG. 5 shows a process of calculating 3 minimum values among 8 distance values of 4 bits according to an exemplary embodiment of the present invention.

An upper bit indicates $P(i)^1$ and a lower bit indicates $P(i)^0$.

During an initializing process, $P(i)^1$ and $P(i)^0$ are set to 0. In the case of satisfying a condition that sum≤5, when the j-th bit satisfies a condition that $(\sim P(i)^0) \& (P(i)^1 | b_i(j))=1$, $P(i)^1$ is set to 1. In the case of satisfying a condition that sum≥5, when the j-th bit satisfies a condition that $(\sim P(i)^0) \& (P(i)^1 | b_i(j))=1$, $P(i)^0$ is set to 0.

As seen in FIG. 5, when each of $P(i)^1$ and $P(i)^0$ is set to 1 once, a value thereof is not changed to the end, and a case in which $P(i)^1$ and $P(i)^0$ are simultaneously 1 does not occur.

Figure 6:
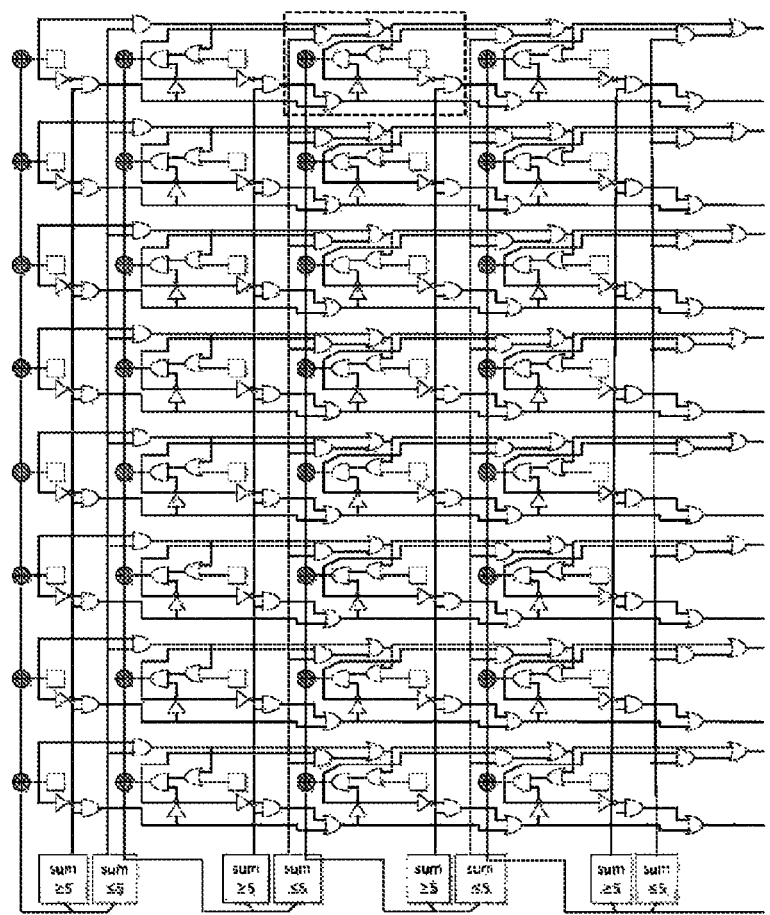
FIG. 6 is a circuit diagram showing a process of calculating 3 minimum values among 8 distance values of 4 bits.

FIG. 6 is a circuit diagram showing a process of calculating 3 minimum values among 8 distance values of 4 bits.

A portion indicated by a dotted box in FIG. 6 is a basic block. The circuit diagram of FIG. 6 has a structure in which m basic blocks are repeated. When M increases, the number of rows increases, and when B increase, the number of columns increases.

When the suggested algorithm is applied, $N=2^n$ minimum values selected among M values are indicated by a flag 1 and are disposed and searched among the M values. Therefore, there is a need to gather and re-sort the selected minimum values.

Figure 7:
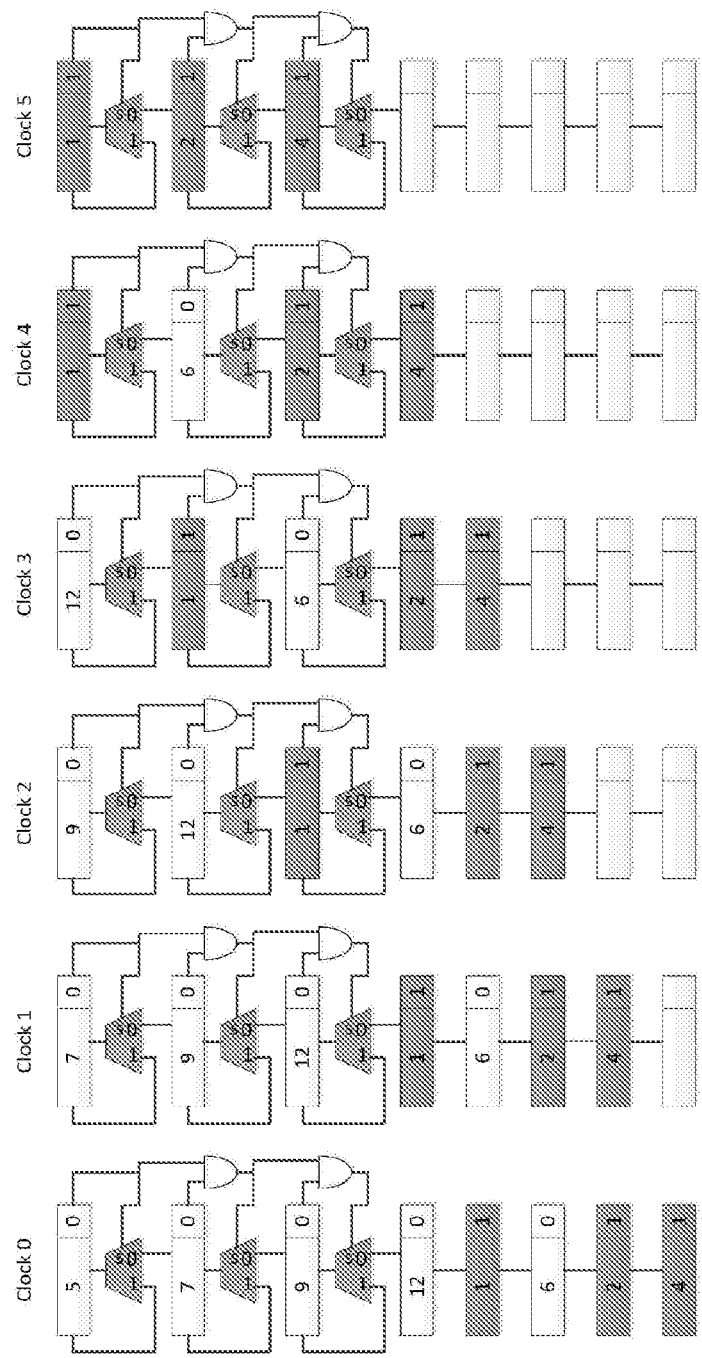
FIG. 7 shows a method of sorting selected minimum values.

FIG. 7 shows a method of sorting selected minimum values. This uses a shift register.

In order to allow N minimum values to remain, M−N+1 clocks are required. In this case, N(B+1) multiplexer and N−1 2-input AND gates are required. In the re-sort scheme as described above, the N minimum values are not sequentially sorted unlike a Merge Sort scheme.

Figure 8:
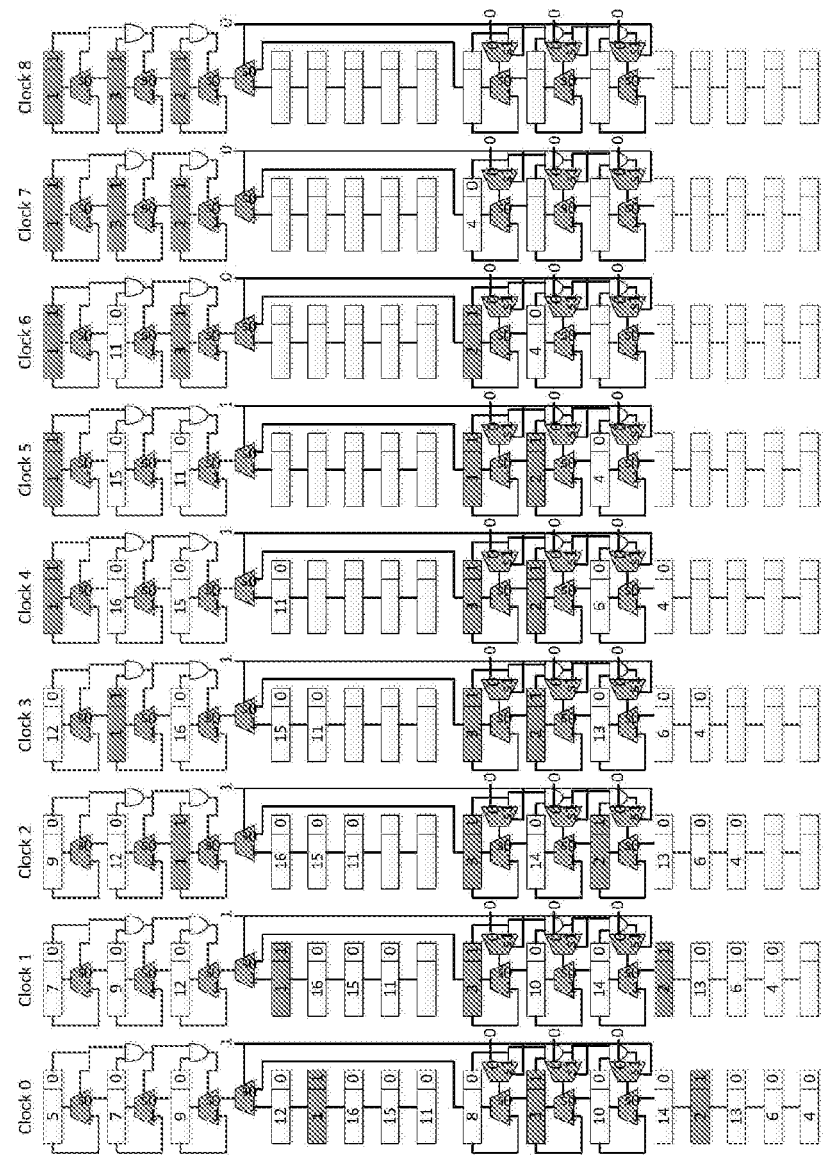
FIG. 8 shows a method of re-sorting 3 minimum values selected among 16 values.

FIG. 8 shows a method of re-sorting 3 minimum values selected among 16 values.

After a method of allowing 3 minimum values among 8 values to remain is performed twice, a method of re-sort 3 minimum values among the 6 minimum values is performed to reduce the number of clocks.

In the case of using the method of FIG. 7, 14 clocks are required. However, the same work may be performed using 9 clocks.

When the suggested scheme is applied to a case in which N=1, a method of calculating a minimum value among M is obtained.

Figure 9:
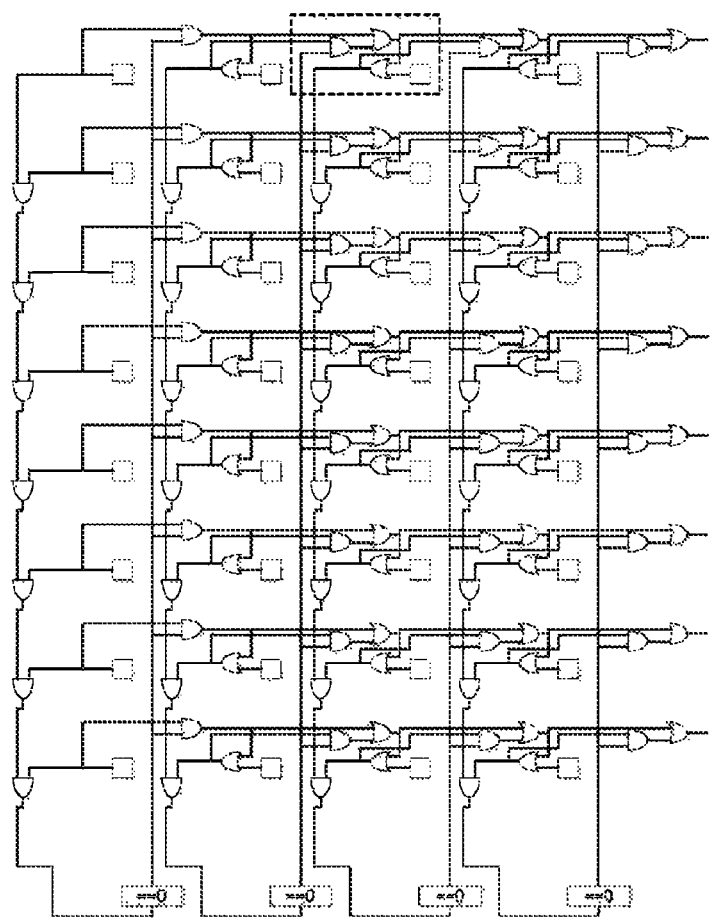
FIG. 9 is a circuit diagram showing a method of calculating a minimum value among 8 distance values of 4 bits.

FIG. 9 is a circuit diagram showing a method of calculating a minimum value among 8 distance values of 4 bits. A portion represented by a black dotted line in FIG. 9 is a basic block. The circuit diagram of FIG. 9 has a structure in which basic blocks are repeated. When M increases, the number of rows increases, and when B increases, the number of columns increases.

Checking whether sum≤M−1 becomes the same as performing an AND operation of M bits, and it is not required to check whether sum≥M−1, such that a circuit configuration becomes simple.

Figure 10:
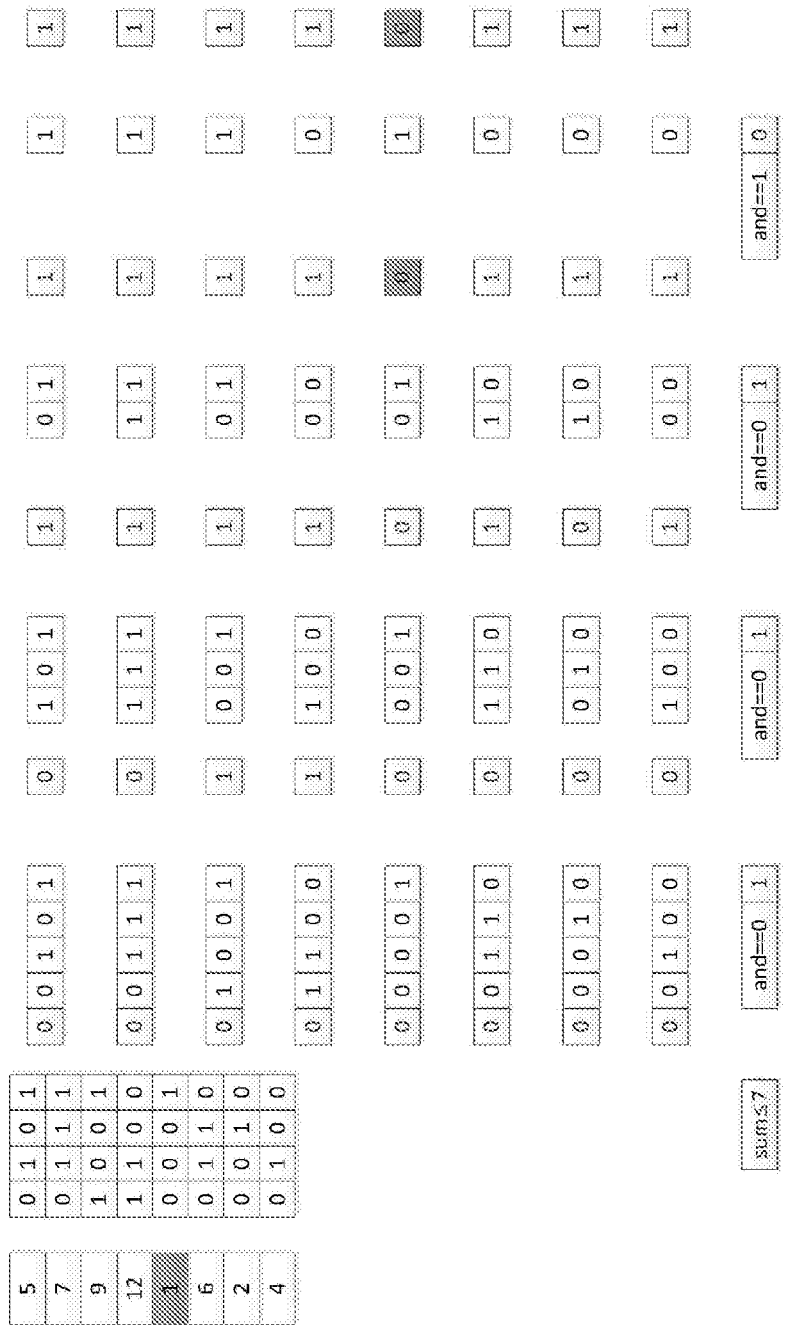
FIG. 10 show a process of calculating a minimum value among 8 distance values of 4 bits.

FIG. 10 show a process of calculating a minimum value among 8 distance values of 4 bits.

A red bit indicates $P(i)^1$. During an initializing process, $P(i)^1$ is set to 0. A condition that sum≤7, that is, whether or not all $(P(i)^1 | b_i(j))$ are 1 is determined by an AND gate. In the case of satisfying the condition, $P(i)^1$ is set to 1. Also in this case, when each of $P(i)^1$ is set to 1 once, a value thereof is not changed to the end.

Hereinafter, the number of comparators and a critical path of the Merge-Sort method of calculating 64 minimum values among 256 distance values are compared with those of the suggested scheme to compare complexities with each other.

Assume that each metric is B bits. According to the suggested method, a critical path performs 256 1-bit additions B times.

Figure 11:
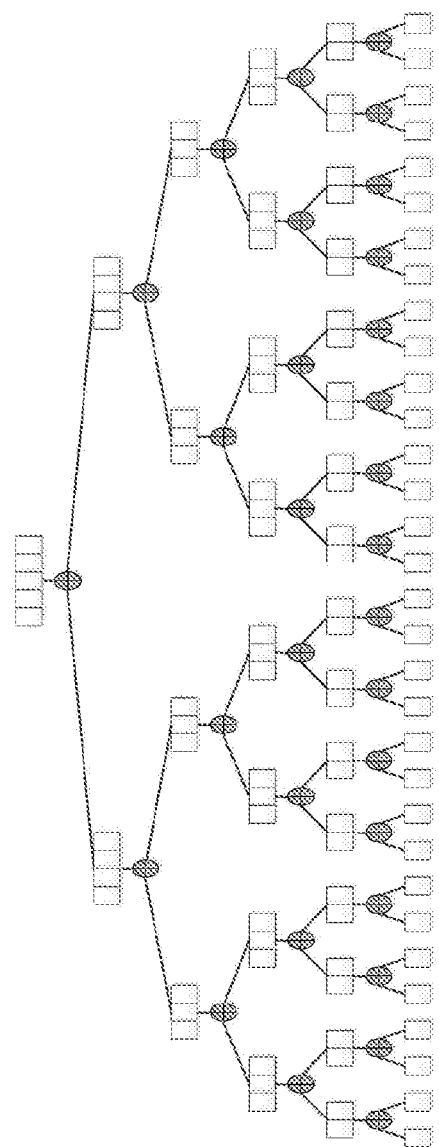
FIG. 11 shows 32 1-bit additions.

FIG. 11 shows 32 1-bit additions. When it is assumed that 256 1-bit additions are implemented by being extended to the method as shown in FIG. 11, 128 1-bit additions, 64 2-bit additions, 32 3-bit additions, 16 4-bit additions, 8 5-bit additions, 4 6-bit additions, 2 7-bit additions, and 1 8-bit addition are required.

In order to approximately compare complexities with each other, in the case of using a metric of $B=2^b$ bits, the number of gates and a critical path required to design a circuit using a 2-input NAND gate are calculated. Assume that a comparator of the Merge-Sort method is implemented using a ripple carry subtractor of B bits. Each comparator and multiplexer may be implemented by 10B+16B 2-input gates. The critical path passes through 7B+5 NAND gates. In order to further increase a speed, the comparator may be implemented by the following Equation:

$$X>Y: X_{B-1}\overline{Y}_{B-1}+a_{B-1}X_{B-2}\overline{Y}_{B-2}+a_{B-1}a_{B-2}X_{B-3}$$
$$Y_{B-3}+\ldots+a_{B-1}a_{B-2}\ldots a_1X_0Y_0 \quad \text{[Equation 11]}$$

where $a_i = X_iY_i + \overline{X}_i\overline{Y}_i$.

In this case, each comparator and multiplexer may be implemented by $19B-9+16B$ 2-input NAND gates, and the critical path passes through $2B+2b+5$ NAND gates.

The complexity of the Merge-Sort of sorting $M=2^m$ values may be calculated by calculating the number of comparators in the scheme as calculated in FIG. 3.

The complexity at the time of using the suggested algorithm may be calculated as follows.

When $M=2^m$ 1-bit additions are calculated by a method as shown in FIG. 11, $2^{m+1}-m-1$ 1-bit full adders are required. When it is assumed that the comparator is implemented using a ripple carrier subtractor of m bits and remaining gates are considered using FIG. 6, the comparator may be implemented by $(2^{m+1}-m-1+10\ m+17\times 2^m)B$ 2-input NADN gates. The critical path passes through $(3m(m+1)+7\ m+6)B$ NAND gates.

The complexities of the Merge-Sort scheme and the suggested invention through the above-mentioned method are shown in Table 1.

TABLE 1

|  |  | Merge-Sort 1 | | Merge-Sort 2 | | Suggested Invention | |
|---|---|---|---|---|---|---|---|
| $M = 2^m$ | $B = 2^b$ | Complexity | Critical Path | Complexity | Critical Path | Complexity | Critical Path |
| 16 | 8 | 209,664 | 610 | 273,168 | 270 | 2,712 | 752 |
|  | 16 | 419,328 | 1,170 | 555,408 | 450 | 5,424 | 1,504 |
| 64 | 8 | 451,776 | 1,281 | 588,612 | 567 | 10,152 | 1,392 |
|  | 16 | 903,552 | 2,457 | 1,196,772 | 945 | 20,304 | 2,784 |
| 256 | 8 | 798,512 | 2,196 | 1,040,369 | 972 | 39,480 | 2,224 |
|  | 16 | 1,597,024 | 4,212 | 2,115,289 | 1,620 | 78,960 | 4,448 |

It is appreciated that when the suggested scheme is used, a length of the critical path slightly increases; however, the complexity significantly decreases. This advantage is more prominent when a size of M is small.

Table 2 shows results of calculating the complexity for applying the re-sort scheme suggested in FIG. 7 using the number of NAND gates.

TABLE 2

| | Number of Minimum Value | | | | | | | | |
|---|---|---|---|---|---|---|---|---|---|
| | N = 4 | | | N = 16 | | | N = 64 | | |
| Distance Bit | B = 8 | B = 16 | B = 32 | B = 8 | B = 16 | B = 32 | B = 8 | B = 16 | B = 32 |
| Number of NAND Gate | 294 | 550 | 1,062 | 1,182 | 2,206 | 4,254 | 4,734 | 8,830 | 17,022 |

The complexities of the suggested method of calculating a minimum value and a method of using a comparator are compared with each other.

Consider a case of calculating a minimum value among $M=2^m$ distance values. When it is assumed that the comparator is implemented using a ripple carry subtractor, each comparator and multiplexer may be implemented by $10B+8B$ 2-input NAND gates. The critical path passes through $7B+5$ NAND gates. The number of all comparators is $M-1$, and the number of comparators of the critical path is m.

According to the suggested invention, in order to perform an AND operation on M bits, $M-1$ 2-input AND gates are required for each bit, and it is necessary to invert an output 1 bit. When remaining circuit elements of FIG. 9 are calculated using the number of NAND gates, the entire complexity may be implemented by $B(2M-1+8M)$ 2-input NAND gates, and the critical path passes through $(2m+5)B$ NAND gates.

The complexities of the method of calculating a minimum value using a comparator and the suggested invention are shown in Table 3.

TABLE 3

| | | Method of Using Comparator | | Suggested Invention | |
|---|---|---|---|---|---|
| $M = 2^m$ | $B = 2^b$ | Complexity | Critical Path | Complexity | Critical Path |
| 16 | 8 | 2,160 | 244 | 1,272 | 104 |
|  | 16 | 4,320 | 468 | 2,544 | 208 |
| 64 | 8 | 9,072 | 366 | 5,112 | 136 |
|  | 16 | 18,144 | 702 | 10,224 | 272 |
| 256 | 8 | 36,720 | 488 | 20,472 | 168 |
|  | 16 | 73,440 | 936 | 40,944 | 336 |

As compared to the method of using a comparator, the complexity of the suggested invention decreases by about a half, and the length of the critical path also decreases by a half or more. This difference is more prominent when a size of M is small.

As compared to the result of Table 1 of calculating N minimum values, the complexity decreases by about a half, and the addition is replaced by the AND gate, such that the length of the critical path decreases by a half or more.

Figure 12:
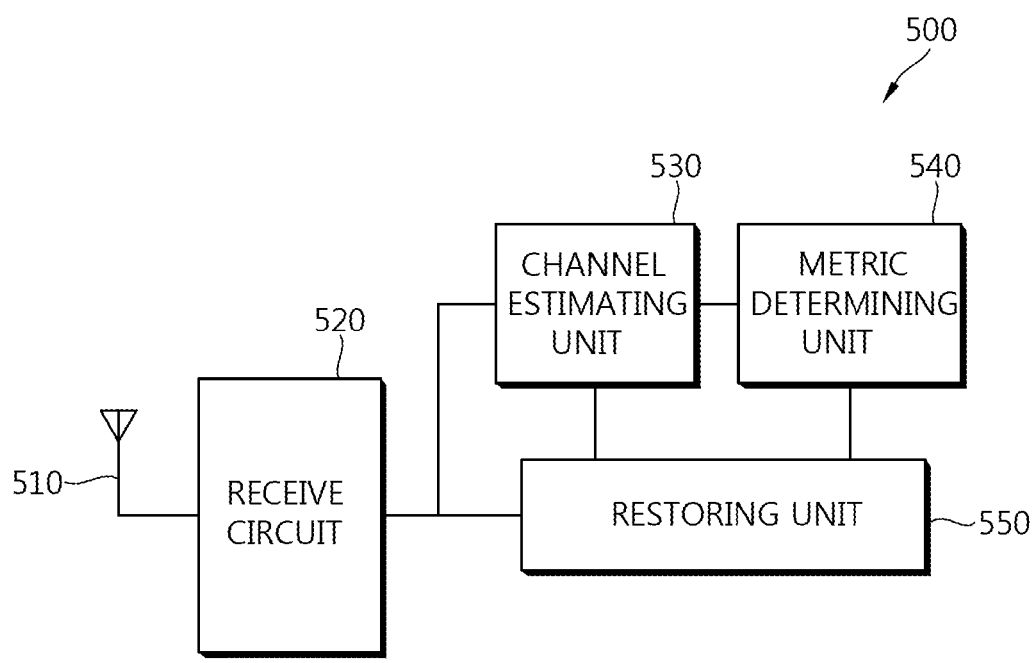
FIG. 12 is a block diagram showing a receiver implementing a suggested embodiment.

FIG. 12 is a block diagram showing a receiver implementing a suggested embodiment.

The receiver 500 includes a receive circuit 520, a channel estimating unit 530, a metric determining unit 540, and a restoring unit 550.

The receive circuit 520 receives receive signals from a transmitter through a receive antenna 510.

The channel estimating unit 530 estimate channels between the receiver 500 and the transmitter.

The metric determining unit 540 determines M metrics (P(i)) represented by B bits based on the channel on which the receive signal is received and selects N metrics having a small size among the M metric. The suggested function and method may be implemented by the metric determining unit 540. The metric determining unit 540 may initialize two comparison values ($P(i)^0$ and $P(i)^1$) to 0 for each of the M metrics, calculate the sum $$(\text{sum}(j) = \sum_{i=1}^{M} (\sim P(i)^0) \ \& \ (P(i)^1 \mid b_i(j)),$$

where j=0, 1, . . . , B−1) for each bit of the M metrics, compare the sum (sum(j)) of the j-th bits with (M−N) to determine $P(i)^0$ and $P(i)^1$ for each of the M metrics, and select at least one P(i) having a $P(i)^0$ value of 1.

The restoring unit 550 restores a transmit signal transmitted by the transmitter from the receive signal based on the N metrics.

The complexity for configuring the circuit may be reduced, and the length of the critical path may be reduced.

Embodiments of the present invention may be provided on a computer readable medium. Examples of computer readable media include Random Access Memory (RAM), flash memory, Erasable Programmable Read Only Memory (EPROM), or other forms of semiconductor memory, a computer hard drive such as a magnetic or solid-state hard drive, optical media such as a Compact Disc Read-only Memory (CD-ROM), a magnetic storage device, etc. The computer readable medium may include a computer executable program thereon, the computer readable medium comprising code for performing steps in accordance with methods described above.

In view of the exemplary systems described herein, methodologies that may be implemented in accordance with the disclosed subject matter have been described with reference to several flow diagrams. While for purposes of simplicity, the methodologies are shown and described as a series of steps or blocks, it is to be understood and appreciated that the claimed subject matter is not limited by the order of the steps or blocks, as some steps may occur in different orders or concurrently with other steps from what is depicted and described herein. Moreover, one skilled in the art would understand that the steps illustrated in the flow diagram are not exclusive and other steps may be included or one or more of the steps in the example flow diagram may be deleted without affecting the scope and spirit of the present disclosure.

What is claimed is:

1. A non-transitory computer-implemented method for determining a path metric in a receiver by selecting N metrics among M metrics, where M>N≥1, the method comprising:

determining, using a computer processor, M metrics $P(i)=[b_i(B-1) \ldots b_i(1) \ b_i(0)]$, where i=1, . . . , M, each P(i) being represented by B bits;

initializing, using a computer processor, two comparison values, $P(i)^0$ and $P(i)^1$, to zero for each P(i);

determining, using a computer processor, a sum of j-th bit for M P(i)s, where j=0, 1, . . . , B−1, as shown:

$$\text{sum}(j) = \sum_{i=1}^{M} (\sim P(i)^0) \ \& \ (P(i)^1 \mid b_i(j))$$

where sum(j) denotes the sum of j-th bit for M P(i)s, '~' denotes a bit inversion operation, '&' denotes a bit AND operation, and '|' denotes a bit OR operation;

updating, using a computer processor, $P(i)^0$ and $P(i)^1$ for each P(i) by comparing sum(j) and (M−N); and selecting, using a computer processor, at least one P(i) having a $P(i)^0$ value of 1 among M P(i)s.

2. The method of claim 1, further comprising:

selecting, using a computer processor, at least one P(i) having a $P(i)^0$ value of 1 and a $P(i)^1$ value of 0 when the number of selected P(i) is smaller than N.

3. The method of claim 2, wherein the step of updating $P(i)^0$ and $P(i)^1$ for each P(i) includes updating $P(i)^0$ to 1 with respect to i in which $(\sim P(i)^0)\&P(i)^1|b_i(j))=0$ when sum(j) is larger than (M−N).

4. The method of claim 3, wherein the step of updating $P(i)^0$ and $P(i)^1$ for each P(i) includes updating $P(i)^1$ to 1 with respect to i in which $(\sim P(i)^0)\&P(i)^1|b_i(j))=1$ when sum(j) is smaller than (M−N).

5. The method of claim 4, wherein the step of updating $P(i)^0$ and $P(i)^1$ for each P(i) includes:

when sum(j) is the same as (M−N), updating $P(i)^0$ to 1 with respect to i in which $(\sim P(i)^0)\&P(i)^1|b_i(j))=0$ and updating $P(i)^1$ to 1 with respect to i in which $(\sim P(i)^0)\& (P(i)^1|b_i(j))=1$.

6. A method of receiving data, the method comprising:

receiving, by a receiver, a receive signal from a transmitter;

determining, by the receiver, M metrics $P(i)=[b_i(B-1) \ldots b_i(1) \ b_i(0)]$ of the receiver, where i=1, . . . , M, based on a channel on which the receive signal is received, each P(i) being represented by B bits;

determining, by the receiver, N metrics among the M P(i)s, where M>N≥1; and restoring, by the receiver, a transmit signal transmitted by the transmitter from the receive signal based on the N metrics, wherein the step of determining N metrics includes:

initializing two comparison values, $P(i)^0$ and $P(i)^1$, to zero for each P(i);

determining a sum of j-th bit for M P(i)s, where j=0, 1, . . . , B−1, as shown:

$$\text{sum}(j) = \sum_{i=1}^{M} (\sim P(i)^0) \ \& \ (P(i)^1 \mid b_i(j))$$

where sum(j) denotes the sum of j-th bit for M P(i)s, '~' denotes a bit inversion operation, '&' denotes a bit AND operation, and '|' denotes a bit OR operation;

updating, by the receiver, $P(i)^0$ and $P(i)^1$ for each P(i) by comparing sum(j) and (M−N); and selecting, by the receiver, at least one P(i) having a $P(i)^0$ value of 1 among M P(i)s.

7. The method of claim 6, wherein the step of determining N metrics further includes:

selecting at least one P(i) having a $P(i)^0$ value of 1 and a $P(i)^1$ value of 0 when the number of selected P(i) is smaller than N.

8. The method of claim 7, wherein the step of updating $P(i)^0$ and $P(i)^1$ for each P(i) includes updating $P(i)^0$ to 1 with respect to i in which $(\sim P(i)^0)\&P(i)^1|b_i(j))=0$ when sum(j) is larger than (M−N).

9. The method of claim 8, wherein the step of updating $P(i)^0$ and $P(i)^1$ for each P(i) includes updating $P(i)^1$ to 1 with respect to i in which $(\sim P(i)^0)\&P(i)^1|b_i(j))=1$ when sum(j) is smaller than (M−N).

10. The method of claim 9, wherein the step of updating $P(i)^0$ and $P(i)^1$ for each P(i) includes:

when sum(j) is the same as (M−N), updating $P(i)^0$ to 1 with respect to i in which $(\sim P(i)^0)\&(P(i)^1|b_i(j))=0$ and updating $P(i)^1$ to 1 with respect to i in which $(\sim P(i)^0)\&(P(i)^1|b_i(j))=1$.

11. A receiver comprising:

a receive circuit configured for receiving a receive signal from a transmitter;

a metric determining unit configured for determining M metrics $P(i)=[b_i(B-1) \ldots b_i(1) b_i(0)]$, where $i=1, \ldots, M$, based on a channel on which the receive signal is received, each P(i) being represented by B bits, and determining N metrics among the M P(i)s, where $M>N\geq 1$; and a restoring unit configured for restoring a transmit signal transmitted by the transmitter from the receive signal based on the N metrics, wherein the metric determining unit is configured for determining N metrics by:

initializing two comparison values, $P(i)^0$ and $P(i)^1$, to zero for each P(i);

determining a sum of j-th bit for M P(i)s, where $j=0, 1, \ldots, B-1$, as shown:

$$sum(j) = \sum_{i=1}^{M} (\sim P(i)^0) \& (P(i)^1 | b_i(j))$$

where sum(j) denotes the sum of j-th bit for M P(i)s, '∼' denotes a bit inversion operation, '&' denotes a bit AND operation, and '|' denotes a bit OR operation;

updating $P(i)^0$ and $P(i)^1$ for each P(i) by comparing sum(j) and (M−N); and selecting at least one P(i) having a $P(i)^0$ value of 1 among M P(i)s.

12. The receiver of claim 11, wherein the metric determining unit is configured for determining N metrics by:

selecting at least one P(i) having a $P(i)^0$ value of 1 and a $P(i)^1$ value of 0 when the number of selected P(i) is smaller than N.

13. The receiver of claim 12, wherein the metric determining unit is configured for updating $P(i)^0$ and $P(i)^1$ for each P(i) by:

updating $P(i)^0$ to 1 with respect to i in which $(\sim P(i)^0)\& P(i)^1|b_i(j))=0$ when sum(j) is larger than (M−N).

14. The receiver of claim 13, wherein the metric determining unit is configured for updating $P(i)^0$ and $P(i)^1$ for each P(i) by:

updating $P(i)^1$ to 1 with respect to i in which $(\sim P(i)^0)\&(P(i)^1|b_i(j))=1$ when sum(j) is smaller than (M−N).

15. The receiver of claim 14, wherein the metric determining unit is configured for updating $P(i)^0$ and $P(i)^1$ for each P(i) by:

when sum(j) is the same as (M−N), updating $P(i)^0$ to 1 with respect to i in which $(\sim P(i)^0)\& P(i)^1|b_i(j))=0$ and updating $P(i)^1$ to 1 with respect to i in which $(\sim P(i)^0)\&(P(i)^1|b_i(j))=1$.

* * * * *